US009917148B2

(12) United States Patent
Delamarche et al.

(10) Patent No.: US 9,917,148 B2
(45) Date of Patent: Mar. 13, 2018

(54) SELF-LIMITED, ANISOTROPIC WET ETCHING OF TRANSVERSE VIAS IN MICROFLUIDIC CHIPS

(71) Applicant: International Business Machines Corporation, Armonk, NY (US)

(72) Inventors: Emmanuel Delamarche, Thalwil (CH); Bilge Eker, Meilen (CH); Yuksel Temiz, Zug (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/933,958

(22) Filed: Nov. 5, 2015

(65) Prior Publication Data

US 2016/0133517 A1 May 12, 2016

(30) Foreign Application Priority Data

Nov. 7, 2014 (GB) .................................. 1419879.0

(51) Int. Cl.
*H01L 21/4763* (2006.01)
*H01L 29/04* (2006.01)
(Continued)

(52) U.S. Cl.
CPC ...... *H01L 29/045* (2013.01); *B01L 3/502707* (2013.01); *F16K 99/0001* (2013.01);
(Continued)

(58) Field of Classification Search
CPC .................................................... H01L 29/045
(Continued)

(56) References Cited

U.S. PATENT DOCUMENTS

2002/0045030 A1* 4/2002 Ozin ......................... B32B 3/30
428/173
2005/0035983 A1* 2/2005 Cruchon-Dupeyrat ............... B82Y 10/00
346/140.1

(Continued)

FOREIGN PATENT DOCUMENTS

CN          102059161 B        4/2013

OTHER PUBLICATIONS

English translation of CN102059161B by Nie Fuqiang et al.; Chinese Acad Inst Chemistry, Apr. 10, 2013.

*Primary Examiner* — Ajay K Arora
(74) *Attorney, Agent, or Firm* — David M. Quinn; Michael J. Chang, LLC (57) ABSTRACT

The present invention is notably directed to a method of fabrication of a microfluidic chip (1), comprising: providing (S10-S20) a wafer (10, 12) of semiconductor material having a diamond cubic crystal structure, exhibiting two opposite main surfaces (S1, S2), one on each side of the wafer, and having, each, a normal in the <100> or <110> direction; and performing (S30) self-limited, anisotropic wet etching steps on each of the two main surfaces on each side of the wafer, to create a via (20, 20a) extending transversely through the thickness of the wafer, at a location such that the resulting via connects an in-plane microchannel (31) on a first one (S1) of the two main surfaces to a second one (S2) of the two main surfaces, the via exhibiting slanted sidewalls (20s) as a result of the self-limited wet etching. The invention further concerns microfluidic chips accordingly obtained.

15 Claims, 5 Drawing Sheets

(51) Int. Cl.
  *H01L 29/16* (2006.01)
  *F16K 99/00* (2006.01)
  *B01L 3/00* (2006.01)

(52) U.S. Cl.
  CPC .............. *H01L 29/04* (2013.01); *H01L 29/16* (2013.01); *B01L 2300/0816* (2013.01); *B01L 2300/0874* (2013.01); *B01L 2300/0887* (2013.01)

(58) Field of Classification Search
  USPC .......................................... 257/621; 438/629
  See application file for complete search history.

(56) References Cited

U.S. PATENT DOCUMENTS

2013/0032483 A1    2/2013   Tan et al.
2016/0367985 A1*   12/2016   Delamarche ...... B01L 3/502707

\* cited by examiner

FIG. 7
Back Side

FIG. 8
Front Side

SELF-LIMITED, ANISOTROPIC WET ETCHING OF TRANSVERSE VIAS IN MICROFLUIDIC CHIPS

FIELD OF THE INVENTION

The invention relates in general to the field of microfluidic chips and fabrication thereof. In particular, it is directed to the fabrication of transverse vias and in three-dimensional (3D) flowpaths in such microfluidic chips.

BACKGROUND OF THE INVENTION

Microfluidics generally refers to microfabricated devices, which are used for pumping, sampling, mixing, analyzing and dosing liquids. Prominent features thereof originate from the peculiar behavior that liquids exhibit at the micrometer length scale. Flow of liquids in microfluidics is typically laminar. Volumes well below one nanoliter can be reached by fabricating structures with lateral dimensions in the micrometer range. Reactions that are limited at large scales (by diffusion of reactants) can therefore be accelerated.

Many microfluidic devices have user chip interfaces and closed flowpaths. Closed flowpaths facilitate the integration of functional elements (e.g. heaters, mixers, pumps, signal detector, valves, air vents, etc.) into one device while minimizing problems related to leaks and evaporation.

Most of the microfluidic chips are made in polymer or silicon (Si). Si microfluidic chips have a number of advantages for performing bioassays but these chips are expensive to fabricate and integrating reagents into Si chips is difficult. The price of Si microfluidic chips scales with their area and both the Si wafers and microfabrication techniques are expensive. One reason why it is difficult to integrate reagents in Si chips with a two-dimensional (2D) flow path is that all operations (loading sample, monitoring signal, integrating reagents, etc.) usually have to be performed on the side of the chip that exhibits the flow path. The depth of structures is limited by the need to keep a minimal residual thickness of the underlying silicon material (to maintain adequate mechanical properties). Thus, the reservoirs and capillary pumps have a limited thickness, which needs be compensated by a large area.

BRIEF SUMMARY OF THE INVENTION

According to a first aspect, the present invention is embodied as a method of fabrication of a microfluidic chip, comprising:
  providing a wafer of semiconductor material having a diamond cubic crystal structure, exhibiting two opposite main surfaces, one on each side of the wafer, and having, each, a normal in the <100> or <110> direction; and
  performing self-limited, anisotropic wet etching steps on each of the two main surfaces on each side of the wafer, to create a via extending transversely through the thickness of the wafer, at a location such that the resulting via connects an in-plane microchannel on a first one of the two main surfaces to a second one of the two main surfaces, the via exhibiting slanted sidewalls as a result of the self-limited wet etching.

In embodiments, the present methods may exhibit one or more of the following features:
  Performing self-limited wet etching steps comprises performing a self-limited wet etching step on each of: the first one of the two main surfaces to concomitantly create the in-plane microchannel and a first portion of the via that extends from the first one of the two surfaces; and the second one of the two main surfaces to create a second portion of the via that extends from the second one of the two surfaces, the second portion of the via rejoining its first portion to form said via;
  The self-limited wet etching steps are performed at locations on each side of the wafer such that the resulting via connects at least one in-plane microchannel on the first one of the two main surfaces to at least one in-plane microchannel on the second one of the two main surfaces;
  The self-limited wet etching steps are performed concomitantly on each of the two main surfaces to concomitantly create one or more in-plane microchannels on each of the surfaces and the via, the latter connecting at least one microchannel on the first one of the two surfaces to at least one microchannel on the second one of the two surfaces;
  Providing the wafer comprises: providing a wafer that comprises: a double-side-polished wafer body exhibiting said two main surfaces; and a hard mask on each of the two main surfaces, the hard mask being one of: an oxide or a nitride hard mask; and performing photolithography and etching steps to remove portions of the hard mask, such that the subsequent self-limited, anisotropic wet etching steps result in etching exposed portions of the wafer body, to create said one or more in-plane microchannels on each of the surfaces and the via;
  Photolithography and etching steps are performed to notably remove two portions of the hard mask, which portions are non-contiguous and have distinct in-plane dimensions and/or orientations, such that a gap remains therebetween, to achieve a mask correction such that a subsequent self-limited, anisotropic wet etching step of two corresponding exposed portions of the wafer body results in creating two corresponding cavities etched through the thickness of the wafer, with the two cavities rejoining at the level of said gap;
  The method further comprises: creating boundaries of the microfluidic chip by performing a further self-limited wet etching step, preferably concomitantly with said self-limited wet etching steps, the created boundaries extending transversely through a portion of the thickness of the wafer, such that a residual thickness of the wafer at the level of the boundaries enables separation of the chip from a remainder of the wafer, by cleaving it by hand; and separating the chip from the remainder of the wafer by cleaving it by hand;
  The method further comprises, after performing the self-limited wet etching steps, applying: a first cover-film on said first one of the surfaces, which preferably covers an opening of the via as well as one or more in-plane microchannels on said first one of the surfaces; and, preferably, a second cover-film on said second one of the two main surfaces to cover one or more in-plane microchannels provided on said surface, wherein the cover film applied more preferably comprises an opening facing an opening of the via on said second one of the surfaces; and
  Applying a cover-film comprises: providing a film comprising at least two layers, including a cover film and a backing film; applying the cover film provided against a surface of the wafer by laminating the backing film; and removing the backing film, wherein this cover-film applied is preferably a dry-film resist, and wherein, more preferably, this cover-film fulfills one or more of the following conditions: it comprises an epoxy resin; it is a laminate sheet; has a Young's modulus between 3 and 5 gigapascal; and a thickness of the dry-film resist applied is between 10 micrometers (μm) and 100 μm.

According to another aspect, the invention is embodied as a microfluidic chip obtainable by the method of fabrication according to any one of the above embodiments, comprising: a wafer of semiconductor material having a diamond cubic crystal structure, exhibiting two opposite main surfaces, one on each side of the wafer, and having, each, a normal in the <100> or <110> direction, wherein the wafer comprises a via extending transversely through the thickness of the wafer to connect an in-plane microchannel on a first one of the two main surfaces to a second one of the two main surfaces, the via exhibiting anisotropically wet etched, slanted sidewalls.

In embodiments, the above chip may exhibit one or more of the following features:

The microfluidic chip further comprises one or more microchannels on one or each of the two main surfaces, which microchannels exhibit, each, anisotropically wet etched, slanted sidewalls;

Said via connects at least one in-plane microchannel on the first one of the two main surfaces to at least one in-plane microchannel on the second one of the two main surfaces;

The microfluidic chip further comprises a cover-film on one or each side of the wafer, the cover-film covering one or more in-plane microchannels and an opening of the via on one of the main surfaces;

The cover-film applied is a dry-film resist, having a thickness between 10 μm and 100 μm, and more preferably between 30 μm and 70 μm; and The cover-film fulfills one or more of the following conditions: it comprises an epoxy resin, it is a laminate sheet, and has a Young's modulus between 3 gigapascal and 5 gigapascal.

Devices and methods embodying the present invention will now be described, by way of non-limiting examples, and in reference to the accompanying drawings. Technical features depicted in the drawings are not necessarily to scale.

BRIEF DESCRIPTION OF SEVERAL VIEWS OF THE DRAWINGS

FIGS. 5A-C are various views of a chip as obtained through the fabrication steps of FIGS. 1-4.

DETAILED DESCRIPTION OF THE INVENTION

The following description is structured as follows. First, general embodiments and high-level variants are described (sect. 1). The next section addresses more specific embodiments and technical implementation details (sect. 2).

1. General Embodiments and High-Level Variants

In reference to FIGS. 1-4 and 6, an aspect of the invention is first described, which concerns methods of fabrication of a microfluidic chip 1. Basically, such methods use a wafer 10, 12 of semiconductor material, i.e., having a diamond cubic crystal structure, and exhibiting two opposite (main) surfaces S1, S2, one on each side of the wafer. Each of the main surfaces has a normal in the <100> direction (or in the <110> direction), which makes them suitable for anisotropic wet etching. Most remarkably, the present methods involve self-limited, anisotropic wet etching steps on each of the two main surfaces on each side of the wafer, to create one or more transverse vias 20, 20a, i.e., vias that extend transversely through the thickness of the wafer. A via 20, 20a can be created at a given location, to connect an in-plane microchannel 31 on a first surface S1 (e.g., the backside surface of the wafer) to the second surface S2. The resulting via shall exhibit slanted sidewalls 20s, as a result of the self-limited wet etching.

The material of the wafer body can be of any material that can be anisotropically etched, for instance Si. Anisotropic wet etching processes were also developed for other materials; however, we generally favor the use of Si due to its availability and manufacturability in various industries. Still, other materials may be contemplated, such as Ge, diamond, gray tin, III-V semiconductors, like GaAs, or other III-V or II-VI materials.

The wafer used preferably has a <100> crystal orientation, i.e., the wafer is in that case a <100> wafer with a flat in the <110> direction, such that each of the main surfaces has a normal in the <100> direction, i.e., the face etched is parallel to 100 planes in that case, i.e., orthogonal to the 100 direction in the basis of the reciprocal lattice vectors (diamond structure). However, as noted above, 110 surface orientations can be used as well.

The self-limited wet etching steps allow to create transverse vias, which in turn makes it possible to more easily exploit both sides of the chip (3D paths can be created in the chip). Namely, the transverse vias can connect microfluidic structures on both sides of the chip, which results in increasing the useful area of a chip. Thus, the operations evoked in introduction (loading sample, monitoring signal, integrating reagents, etc.) need not all be performed on the one side of the chip that comprise the flow path. In addition, the self-limited wet etching steps are fully compatible with batch fabrication. In particular, there is no need for dry etching. Since for semiconducting materials having a diamond structure, the wet etching is self-limited, the depth of the microfluidic structures can be controlled by geometry.

Figures 1, 2:
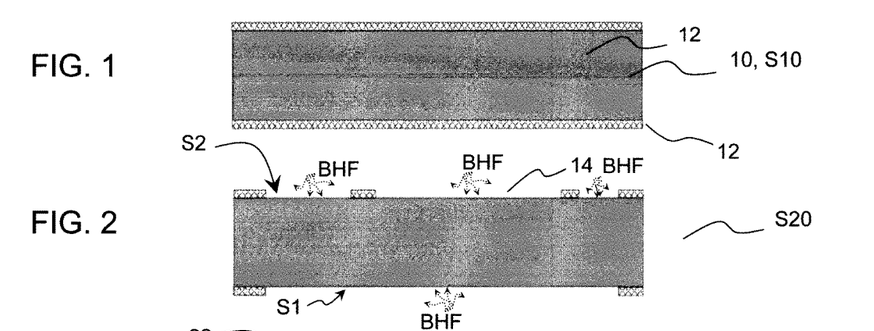
FIGS. 1-4 depict, each, 2D cross-sectional views of a simplified representation of a microfluidic chip at various stage of its fabrication, according to embodiments.
Figure 3:
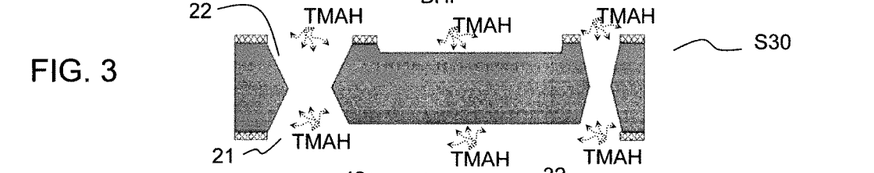

Referring now more specifically to FIG. 3, the self-limited wet etching step S30 on the first surface S1 is preferably performed such as to concomitantly create one or more in-plane microchannels 31 and a first portion 21 of a transverse via 20 (the first portion extending from the first surface S1, as depicted in FIG. 3). More generally, microfluidic structures on the first surface S31 can be created concomitantly with the via(s) 20, 20a, for efficiency. Note that the concept of "microfluidic structures" (also "microfluidic features") is widely used in the literature to denote such features as: microfluidic microchannels, liquid loading pads, electrical contact openings, capillary pumps, etc. Wet etching the second surface S32 will create a second portion 22 of the via, the second portion extending from the second surface S2, such that the first and second portions rejoin to form the via 20.

Anisotropic etching is known to etch along given planes, whose orientation with respect to the exposed surface is known. Thus, simple geometry considerations suffice to design suitably dimensioned areas of the wafer exposed to the wet etchant, in order to arrive at the desired depth for the etched structures. To create through vias: the corresponding exposed surface portions need be dimensioned such that each of the two etched portions 21, 22 has a depth that is larger than the thickness of the wafer, divided by two. On the contrary, to create channels or other microfluidic structures: the corresponding exposed surface need be smaller, such that the corresponding etched areas have a depth that is substantially smaller than the thickness of the wafer, divided by two. The microchannels shall nevertheless, in general, have relatively deep structures, i.e., around a few micrometers (e.g., 5 micrometers) up to 20 micrometers or even more.

Figure 5A:
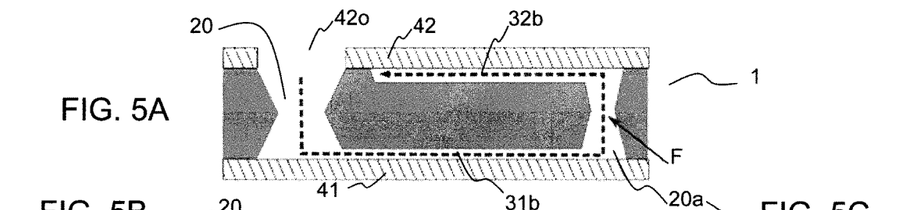
FIG. 5A shows a cross-section view of the chip (seen at a distinct cross-section plane, compared with FIGS. 1-4).
Figure 5B:
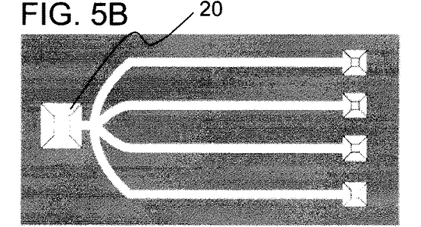
FIGS. 5B and C respectively show backside and frontside views of a chip similar (though not identical) to the chip of FIG. 5A (without the cover-films)
Figure 5C:
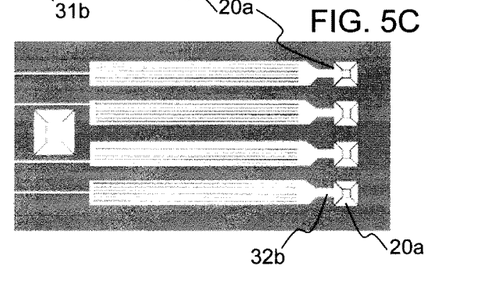
Figure 6:
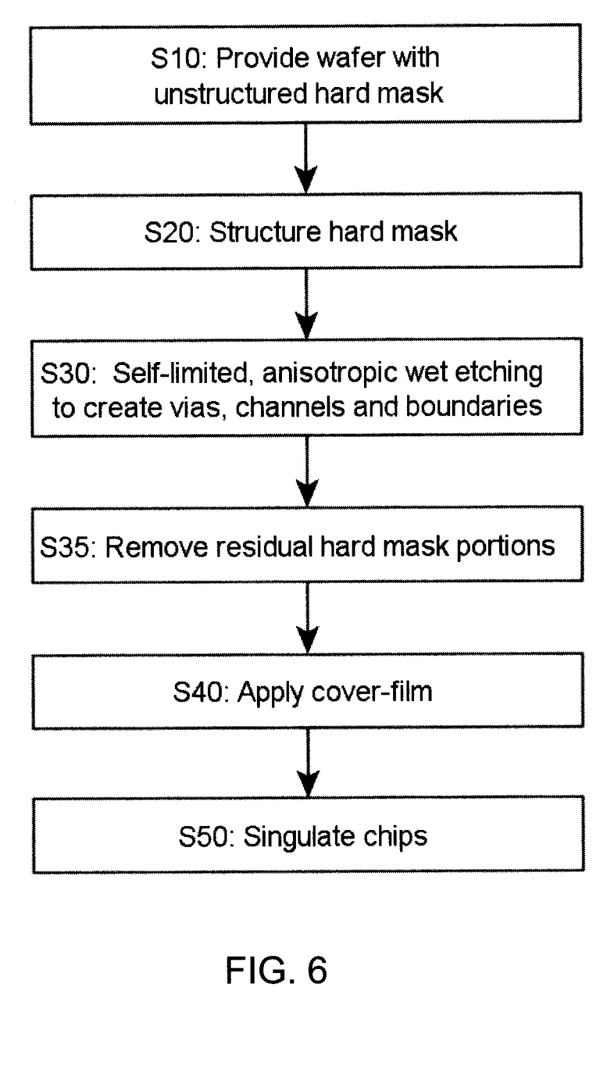
FIG. 6 is a flowchart illustrating high-level steps of a method of fabrication of a chip as in FIG. 4 or 5, according to embodiments.

Preferably, and as depicted in FIGS. 5A-C, the self-limited wet etching steps are performed at locations on each side of the wafer 10, 12, such that a resulting via 20a connects an in-plane microchannel 31b on the first surface S1 to an in-plane microchannel 32b on the second one of the two main surfaces. As further seen in FIGS. 5B-C, 3D flowpaths can thus easily be achieved.

Figure 4:
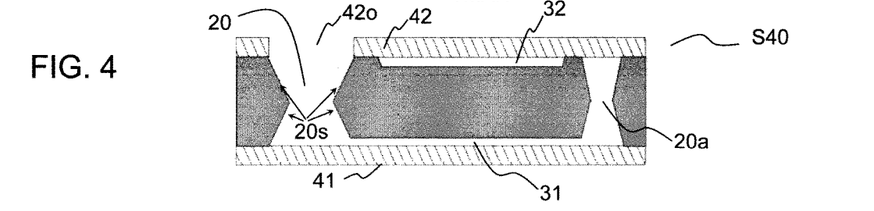

FIGS. 5B and C respectively shows the bottom and top surface (with bottom and top channels 32b and 31b) of a chip, according to embodiments. Here it is noted that the cross-sections shown in FIGS. 4-5A are not fully consistent with the channel structure depicted in FIGS. 5B-C, for the sake of simplicity of representation. Indeed, in FIGS. 4-5A, the first (larger) via 20 is depicted as connecting to the second (smaller) via 20a through a straight channel portion 31, 31b, whereas curved channels are involved in FIGS. 5B-C (because multiplexing is contemplated). Still, FIG. 5A can be understood as corresponding to a virtual cross-section passing through a given channel.

In addition, the cross-section shown in FIG. 5A differs from that of FIG. 4 in that the via 20a connects to the upper channel 32b, whereas it does not appear to connect to the upper channel 32 in FIG. 4, because the cross-section planes considered differ. And as illustrated in FIG. 5C, a vias 20a may connect to wide channel, which itself connects to smaller channels.

As further illustrated in FIGS. 5B-C, the chip 1 may further exhibit a sophisticated architecture of channels: the chip 1 may for instance comprise a larger via 20 that connects to several (smaller) vias 20a through distinct channels, involving junctions.

In embodiments, the self-limited wet etching steps are performed concomitantly on each of the two main surfaces S1, S2, in order to concomitantly create one or more in-plane microchannels 31b, 32b on each of the two main surfaces S1, S2, and one or more of the vias 20, 20a. A via 20a may be located such as to connect one or more microchannels 31b on the first one S1 of the two surfaces to one or more microchannel 32b on the second surface S2. More generally, structures on each of the surfaces S1, S2 can be created concomitantly with the via(s) 20, 20a, for efficiency, a thing that can be achieved thanks to self-limited, wet etching processes.

For example, 15 µm deep structures (microchannels) were obtained, in addition to vias, by wet etching a Si (100) wafer using tetramethylammonium hydroxide (or TMAH). More generally, the average depth of the microchannels (or any microstructure to be processed according to present methods) is between 5 µm and 50 µm. Contrary to usual semiconductor wafer processing, microfluidics generally have deep structures, i.e. around a few micrometers, up to 20 µm or even more, e.g., 50 µm. For instance, 5 µm is already considered a small depth in applications as contemplated herein. There are multiple reasons. For instance, a small depth can generate a large hydraulic resistance on a liquid and can block or become clogged with microbeads and particles. Such a small depth can also be incompatible with samples containing cells. A compromise that was found to suit many applications is to provide microstructure depths between 10 µm and 20 µm.

Figure 10:
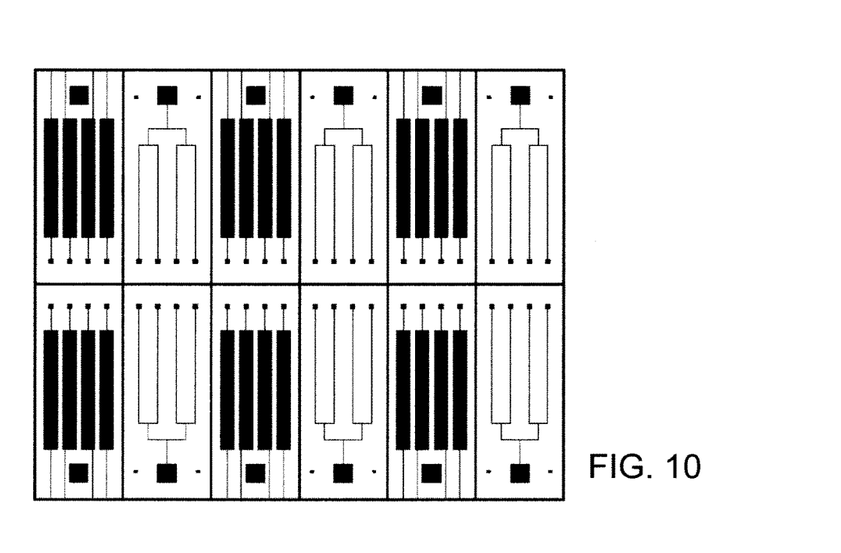
FIG. 10 shows an example of mask layouts used for backside and frontside flow paths of chips for batch fabrication on a wafer.

Referring back to FIG. 1, the wafer 10, 12 provided (step S10) may comprise a double-side-polished wafer body 10 (exhibiting the two main surfaces S1, S2) with a hard mask 12 on each of the two main surfaces. A double-side-polished wafer is preferred, notably high-precision microfluidic structures have to be put each of the two main surfaces of the wafer. Otherwise, single-side-polished wafers can also be used, where, e.g., the polished side comprises high-precision microfluidic structures and vias, and the non-polished side comprises larger structures (e.g., larger vias and channels). In addition, double-side-polished wafers are typically thinner and therefore a shorter time is needed to create the vias. The hard mask is typically an oxide or a nitride hard mask. The hard mask can be prepared S20 using techniques known per se, i.e., photolithography and etching processes, e.g., preferably using a two-step photolithography process for batch fabrication, as illustrated in FIG. 10. In this process, a photoresist is deposited and baked on both sides of the wafer. When using a mask aligner, a positive-tone photoresist on one side of the wafer is exposed through a mask (Cr/glass mask) and developed, then the photoresist on the other side of the wafer is exposed and developed by aligning the mask to already-developed photoresist patterns on the other side. In the case of direct laser writing, the photoresist can be exposed without using a mask. Such tools often have precise optical alignment systems to align the pattern to the wafer edge, so that photoresist on one side of the wafer can be exposed immediately after exposing the previous side without requiring an intermediate development step. For both exposure using mask aligner and direct laser writing, oxide or nitride hard mask on both sides of the wafer can be etched concomitantly using wet etching and photoresist on both sides can be removed concomitantly following the etching of the hard mask. Photolithography and etching techniques shall, in the present context, be suitably used to remove selected portions of the hard mask, such that the subsequent self-limited, anisotropic wet etching steps S30 result in etching exposed portions of the wafer body 10, in view of creating all the needed structures, e.g., one or more in-plane microchannels 31, 32, 31b, 32b on one or each of the surfaces S1, S2 and the via(s) 20, 20a. Still, even though several steps may be needed to prepare the mask (when using mask aligner for exposure), all the microfluidic structures may otherwise be obtained concomitantly, during a same anisotropic wet etching. For example, the hard mask is typically an oxide such as $SiO_2$ or a nitride such as $Si_3N_4$. In such cases, a wet etchant can be used for partially etching the surface, e.g., a buffered oxide etch. A buffered oxide etch is a wet etchant that can be used in etching thin films of oxides or nitrides such as mentioned above. It is a mixture of a buffering agent, such as ammonium fluoride $NH_4F$, and hydrofluoric acid HF, which allows for good process control. The buffered oxide etch may for example be a buffered hydrogen fluoride solution, e.g., when used to etch $SiO_2$. It is denoted by BHF in the appended drawings (step S20, FIG. 2).

Figure 9:
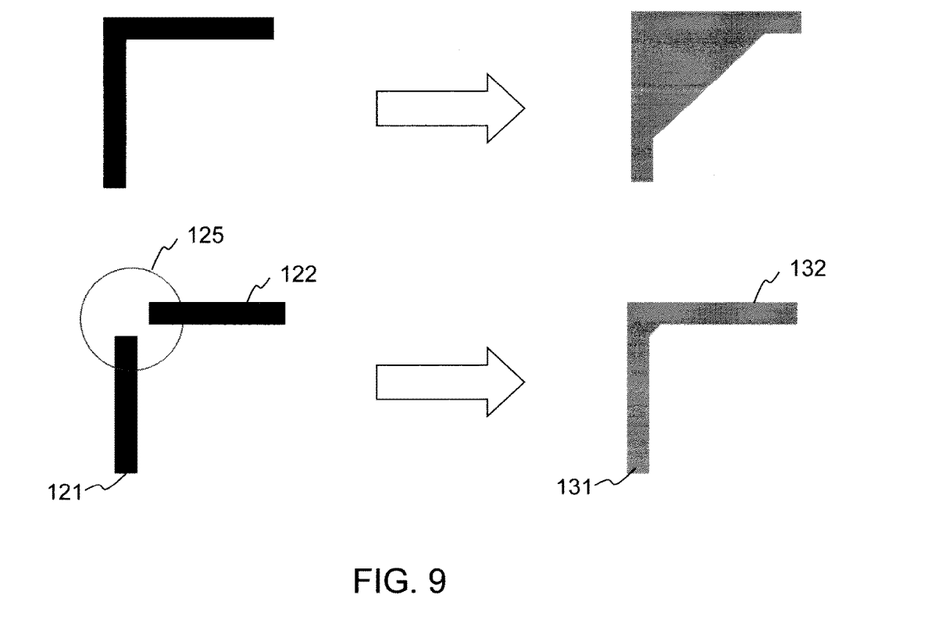
FIG. 9 illustrates an example of mask-correction useful when long anisotropic, wet etching is used, as involved in embodiments.

Advantageously, and referring to FIG. 9, hard mask corrections can be contemplated, especially if long etching steps S30 are expected. Long etching processes may lead to pattern widening, especially where patterned regions exhibit non-self-limiting corners. This, in turn, can decrease the resolution, as channels may become deeper and wider, leading to significant capillary pressure drops. Consider for example the upper pattern of FIG. 9. The outer corner may for example be a self-limiting corner, e.g., if <111> planes merge at the corner, whereas the inner corner may not be self-limiting. Now, although it is negligible compared to <100> planes, the etch rate of <111> planes is not zero. This can be corrected by introducing a gap 125. I.e., if the patterns are not fully merged on the layout (due to the gap), those planes will eventually merge after a long etching. By estimating the time required for merging, undesired pattern widening can therefore be suppressed. Consider for instance a corner pattern as depicted in FIG. 9. Basically, a solution to the pattern widening issue (illustrated in the upper figures) consists in performing the photolithography and etching steps S20 such as to notably remove two portions 121, 122 of the hard mask, which portions are non-contiguous and have distinct in-plane dimensions and/or orientations, whereby a gap 125 remains between the two portions. This way, a mask correction is achieved, such that a subsequent self-limited, anisotropic wet etching step of the two corresponding exposed portions of the wafer body results in creating two corresponding cavities 131, 132 etched through the thickness of the wafer. Using a suitable gap (estimated based on the expected etching time), the two cavities will nevertheless rejoin at the level of the initial gap, upon completion of the self-limited wet etching. Such a correction is all the more advantageous where the two portions 121, 122 have distinct in-plane orientations that involve a non-limiting corner.

Figure 7:
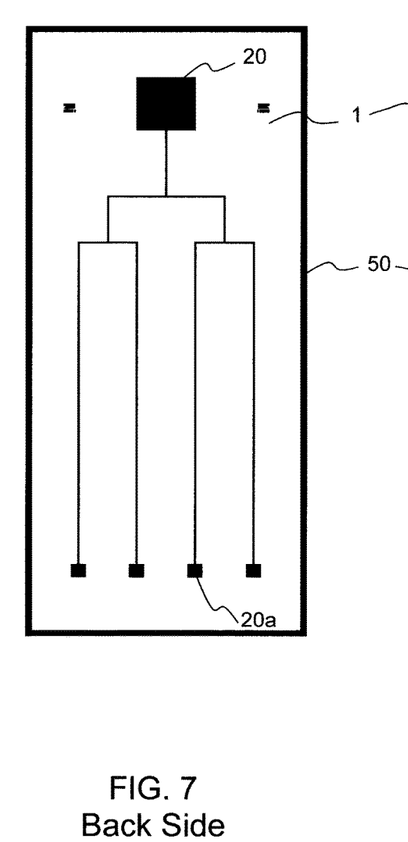
FIGS. 7 and 8 respectively show the backside and frontside of a chip according to embodiments.
Figure 8:
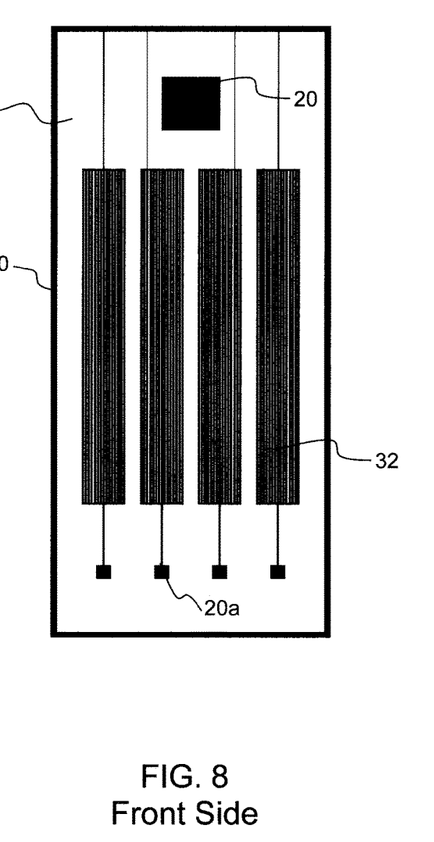

Referring now to FIGS. 7, 8, 10, also boundaries of the chip 1 can be created using self-limited wet etching, in addition to the microfluidic structures. Thus, the present methods may further comprises creating boundaries 50 of the chip 1 by performing a further self-limited wet etching step, which is preferably concomitantly performed with the self-limited wet etching steps S30, whereby all structures of the chip can be created during a same anisotropic wet etching. The created boundaries 50 are cavities that extend transversely to the wafer.

The created boundaries 50 may advantageously be created such as to extend only though a limited portion of the thickness of the wafer body 10, to create cleavable boundaries. This completely eliminates the need for wafer dicing, which is considered as a costly and harsh process for fragile microfluidic structures. The residual thickness of the wafer at the level of the boundaries are in that case such as to make it possible to separate chip(s) from a remainder of the wafer (or from other chips), by cleaving the chip(s) by hand. Since a cover-film (such as a dry film) shall preferably be placed before singulating the chips, the residual thickness of the wafer and the properties of the film should be jointly designed to make it possible to easily singulate the chips. Boundaries can be made wider, to obtain a completely etched chip boundary (i.e., though the full thickness of the wafer body), and thereby singulate chips upon completing the anisotropic etching process. However, this shall normally not be preferred because the chips often need further processing, such as removing residual hard mask portions, applying surface treatments, introducing biological reagents and applying a cover film to close the microfluidic structures.

In that respect, and referring to FIGS. 4, 5, preferred embodiments of the present methods comprise applying one or more cover-film. The concept of cover-film is used in the literature to denote a cover, or a lid, covering and closing microstructures of the chip, i.e., tenting over microfluidic structures to create microfluidic cavities/channels. For example, after performing the self-limited wet etching steps S30, and preferably after having removed residual hard mark portions, if needed, a cover-film (i.e., a rigid film) 41 can be applied S40 on the first (lower) surface S1. Depending on the design option, the film 41 may cover an opening 21 of a via 20, 20a (or not) as well as one or more in-plane microchannels, to close the latter. Typically, a second cover-film 42 is applied on the second (upper) surface S2 as well, to cover one 32 or more microfluidic structures thereon, such as in-plane microchannels. In the example of FIGS. 4-5, the lower film 41 covers both vias 20, 20a and the channel 31, 31b, to enable a flow path F from one via to the other, as depicted by the dotted line in FIG. 5. A film 42 may otherwise comprise openings, to enable access to a given microfluidic structure, e.g., a large via 20 (used as a reservoir). In FIG. 4 or 5, the upper film 42 comprises an opening 42o facing the opening 22 of the via 20, to allow liquid to be introduced in the via 20.

A preferred way of applying S40 the cover-film is the following. The initial film provided may comprise at least two layers, including the cover film and a backing film. Then, the cover film may be applied against a surface of the wafer by laminating the backing film, prior to remove the backing film.

The cover-film may be applied to cover several chips, batch fabricated on a same wafer, which is advantageous for large scale fabrication. The cover film is thus applied at substrate-level, after cleaning, and preferably before singulation of the chips. This cover film must therefore be distinguished from a protective (photoresist) film that can otherwise be applied before dicing. Indeed, protective films are usually applied before dicing to protect a processed wafer. Since here the cover film is applied after cleaning (e.g., after having rinsed, cleaned and dried the partially etched substrate), clean microfluidic structures are obtained for the whole assembly, i.e., at substrate level, a thing that was usually only possible at chip level. Once the exposed surface is sealed with the cover film, the assembly can be singulated and the resulting dies can be readily used. Note that cover-films can be applied to both surfaces concomitantly, e.g., by lamination, to close microfluidic structures on both sides at the same time.

Several materials can be contemplated for the cover-film: of particular interest are dry-film resists (usually optically clear), such as polyepoxide films, which have been found to be best suited for several microfluidic applications. They notably are rigid enough to tent over the channels without collapsing. They can be easily cut or patterned and have good adhesion to the surface to prevent delamination and leaking. As said earlier, most practical is to use a cover film initially provided as a laminate sheet to apply it on the surface of the substrate. In variants, any rigid enough cover film can be contemplated, like silicon or thin glass (its Young's modulus is typically between 4 gigapascal and 200 gigapascal). If an optical clear material is required, glass can be used.

According to many test performed by the inventors, best results for dry-film based on epoxy resin, having a Young's modulus between 3 and 5 gigapascal, and whose thickness is between 20 μm and 100 μm. Optimal results were obtained for thicknesses of about 50 μm (±20 μm), the film itself shall preferably exhibit less than 5% thickness variation.

Sealing is critical for applications that require preventing evaporation and crosstalk of liquids/samples/reagents across different microfluidic structures. Sealing also eliminates the risk of biohazards in case the sample contains toxic or pathogenic substances. Elastosmers such as PDMS were found to contaminate the microfluidic structures, making them hydrophobic due to the surface diffusion of low molecular weight siloxanes. While chips covered with PDMS were useful for experiments and developing the technology, these chips may not have sufficiently long shelf lifetime stability for optimal logistics that is required in diagnostics. When optical transparency, chemical stability, low auto-fluorescence in specific optical regions used for fluorescence assays, conformability with surfaces, mechanical strength, water and air non-permeability become critical requirements, then dry-film resists are better suited, being particularly adapted to the sealing of microfluidic structures as fabricated here. Advantageously, unlike many other bonding techniques, dry-film lamination can be done at lower temperatures (lower than 50° C.), so that biological reagents can be integrated to the chips prior to lamination.

Dry-film resists are more challenging to laminate after they have been photo-exposed. Also, if they are photo-patterned after lamination, liquids such as the developing and rinsing solutions might contaminate microfluidic structures. Therefore, it is preferred to define holes (e.g. for defining loading pads and vents) in the sealing layer before lamination. This can be done by cutting, laser ablation or local photo-patterning, for example.

To summarize, the films 41, 42 applied need be sufficiently rigid not to collapse in the microfluidic structures and enable singulation of the covered chip blocks. To that aim, the film is preferably a dry-film resist, e.g., having a thickness between 20 μm and 100 μm (or more preferably between 30 μm and 70 μm), which further fulfills one or more of the following conditions: it comprises an epoxy resin; it is a laminate sheet; and has a Young's modulus between 3 gigapascal and 5 gigapascal.

Note that the resulting microfluidic chip package or assembly can be provided to a recipient, who can then easily singulate the blocks, without any specific equipment, e.g., simply by hand. The invention can thus be embodied as a single microfluidic chip (obtainable according to present fabrication methods) or as a microfluidic chip package or assembly. A chip can be obtained by separating a covered block from the package or assembly. The resulting chip shall therefore exhibit residual marks of partial cut and residual marks of singulation, such as cleavage planes or parting breaks, at a periphery of a covered block. Residual traces of cuts look like a polished mirror surface in the case of Si wafer.

The above fabrication methods makes it possible to easily fabricate a microfluidic chip with flowpaths on each of its main surfaces. In that respect, and according to another aspect, the invention can be embodied as a microfluidic chip as obtained by such methods. As illustrated in FIG. 4, 5, 7, 8 or 10, such a chip 1 comprises a wafer 10 of semiconductor material (again, having a diamond cubic crystal structure), exhibiting two opposite main surfaces, one on each side of the wafer, and having, each, a normal in one of: the <100> direction or the <110> direction. As per the above fabrication methods, the wafer comprises one or more vias 20, 20a, each extending transversely through the thickness 10 of the wafer to connect an in-plane microchannel 31 on a first one S1 of the two main surfaces to a second one S2 of the two main surfaces. Because of the self-limited, wet etching process used, the via(s) exhibit(s), each, anisotropically wet etched, slanted sidewalls 20s. As illustrated in FIG. 5, a via 20a may connect an in-plane microchannel 31b on one side, to the other side, e.g., to another in-plane microchannel 32b on the other side. If microchannels or other structures of the chip (like boundaries) are fabricated using a self-limited, wet etching process as well, then the microchannels 31, 32 will also exhibit, each, anisotropically wet etched, slanted sidewalls. Depending on the orientation and depth of the structures, they will exhibit one or more pairs of opposite slanted walls.

As explained earlier, the microfluidic chip shall likely comprise a film, such as described above, on one or each side of the wafer, at least partly covering microfluidic structures such as in-plane microchannels. The film may have openings facing vias or other structures.

The above embodiments have been succinctly described in reference to the accompanying drawings and may accommodate a number of variants. Several combinations of the above features may be contemplated. Examples are given in the next section.

In addition, the present invention extends to multiple, interconnected chips. So far, we merely talked about a single wafers, having, each, two processed surfaces. However, the present concept is scalable to multiple wafers, vertically stacked. Namely, several wafers may be sealed with dry-film resists, and bonded together using dry-film resists as intermediate layers, having openings arranged so as to enable fluid communication from one wafer of the stack to the other. This allows to multiply the liquid capacity and the effective length of the via. This does not require substantial additional processing; only a precise patterning and adjustment of the intermediate dry-film resists is needed. For example, a specific arrangement can be designed such that, after pipetting, liquid flows to the very bottom surface, then circulates back to the very top surface, passing through each surface and via.

2. Specific Embodiments/Technical Implementation Details

Detailed embodiments are now described, in which both sides of a microfluidic chip have flow paths that are connected across the chip by one or several vias. The vias provide a substantial volume (typically 1 μL-10 μL) that is easily accessible for integrating reagents and pipetting samples. In addition, optical paths through the vertical vias allows for a better integration of signal, e.g., for optical absorption tests.

The fabrication process of these chips was developed so as to be extremely cost-efficient. To start with, chips are fabricated using a single wet etching step (both sides and vias being processed at the same time). Such an approach is fully compatible with batch fabrication (no need for dry etching). Since a self-limited etching is involved, the depth of the microfluidic structures can be controlled by geometry.

Multiplexing tests is made possible. Also, the chip area is halved (silicon area is saved, which has advantage also in terms of costs). Several μL-reservoirs can be formed without additional packaging step. There is, in addition, no need for dicing the chips.

Finally, there is no strict need for plastic packaging or housing, as the chip is ready to use without additional processing.

2.1 Detailed Example of Fabrication Process

First, some pre-processing steps may be required to prepare the wafer. First, one typically provide a raw wafer 10. The wafer 10 can next be covered by an electrically insulating layer 30. The latter is preferably obtained by oxidizing the substrate 10, e.g., by thermal oxidation. The substrate 10 is preferably a silicon wafer, where the surfaces S1, S2 are generally parallel to (100) surfaces of the Si wafer. I.e., the wafer used is preferably a <100> wafer with a flat in the <110> direction; thus the top surface has a normal in <100> direction and the main surfaces S1, S2 are parallel to (100) planes, i.e., orthogonal to the (100) direction in the basis of the reciprocal lattice vectors (diamond structure for Si). The wafer may be oxidized by thermal oxidation to obtain $SiO_2$ as an insulating layer 12. Etching the $SiO_2$ layer can for instance be performed using a wet etchant such as a buffered hydrogen fluoride solution. The anisotropic silicon etching is preferably performed with TMAH, which results in microstructures having slanted sidewalls.

Anisotropic wet etching is preferred over dry etching techniques because wet etching is compatible with batch processing and therefore can be overall faster, depending on the number of wafers processed. Note that, wet etching is usually slower than dry etching, which can be much faster per wafer. The overall throughput thus depends on the number of wafers processed altogether. The $SiO_2$ mask etching step can else be carried out by dry plasma etching. Here, wet etching is preferred because oxide on both sides of the wafer can be etched at the same time and in batch processing. Anisotropic silicon etching step may be carried out with TMAH, potassium hydroxide (KOH), ethylenediamine pyrocatechol (or EDP), etc. However, TMAH is preferred because it has higher selectivity over the $SiO_2$ mask, also it does not contaminate the wafer. More specifically, contamination is due to metal ions, potassium in the case of KOH, which may cause compatibility issues with CMOS processes. The slanted walls of the structures 20, 31, 32 resulting from the anisotropic etching are parallel to (111) surfaces in that case.

Then, a $SiO_2$ mask removal step can be achieved by dry plasma or wet etching, prior to covering the chip, but wet etching is again preferred, for the same reasons as already explained in respect of the patterning of the $SiO_2$ mask.

The above concept of microfluidic chip assembly was notably demonstrated as follows: a microfluidic test structure with a loading pad, an architecture of channels (100 μm width), vias, with vias 20a and adjoining channels acting as capillary pumps, was fabricated on a 380 μm (4-inch) thick Si wafer. After coating a thin photoresist layer for patterning structures on $SiO_2$, the photoresist was removed and the wafer was partially etched on each side, to create both the microstructures and boundaries. The mask geometry was designed so as to obtain microstructures of about 190 μm-200 μm depth, while boundary lines of about 100 μm were etched on each side (i.e., 100 μm on top and bottom, which is enough for cleaving). A 50 μm thick DF-1050 dry-film resist EMS, USA was cut using a benchtop cutting plotter to create the loading pad and electrical contact openings. This cover film was aligned and laminated on the partially etched wafer, at 45° C.-50° C., and on both sides of the wafer. The back side was fully-covered, the front-side had an opening for liquid loading. Compared to other microfluidic channel sealing techniques such as wafer bonding, the dry-film lamination requires much less time and temperature budget. The sealed chips were then separated easily by cleaving the wafer, by hand. Optical inspection of the cleaved chip shows no substantial structural damage on the cover film.

Methods described herein can be used in the fabrication of wafer-based microfluidic chips. The resulting chips can notably be distributed by the fabricator in raw wafer form (that is, as a single wafer that has multiple unpackaged chips), as a bare die, or in a packaged form. In the latter case a chip is mounted in a single chip package (such as a plastic carrier) or in a multichip package. In any case the chip can then be integrated with other chips, or other microfluidic elements (tubing ports, pumps, etc.) even if applications to autonomous chips are preferred, as part of either (a) an intermediate product or (b) an end product.

As illustrated in FIG. 10, batch fabrication is advantageous. In this example, exactly the same layout was written on both sides of the wafer using a laser writer (DWL200) or mask aligner (SUSS MA8). The mask can be designed such that the back side and front side patterns overlap when the wafer is flipped (with respect to the vertical axis) for the second photolithography step.

By partially overlapping back and front side cavities (or vias), one can define a slit 25 in independent vias 20a (see FIG. 11G-H), which can advantageously be used to integrate reagents, while ensuring a well-defined plane/volume for signal monitoring.

After singulating the chips, one obtains chips such as depicted in FIGS. 7-8. In such chips, capillary filling in the fabricated 3D flow paths works as follows.

(1) The liquid sample is pipetted to the loading reservoir 20 (i.e., a large via), via the front side (FIG. 8). The reservoir can hold about 5 μL;

(2) The liquid directly goes into the tree-structured channels on the back side (FIG. 7), acting as capillary pumps;

(3) It then reaches to the microfluidic vias 20a and goes back to the front side through the vias (4) It is then pulled by the channels 32 on the front side of the chip, which act as capillary pumps.

2.2 Example of Applications

2.2.1 Reagent Integration and Multiplexing

Figures 11A, 11B, 11C, 11D, 11E, 11F, 11G, 11H, 11I:
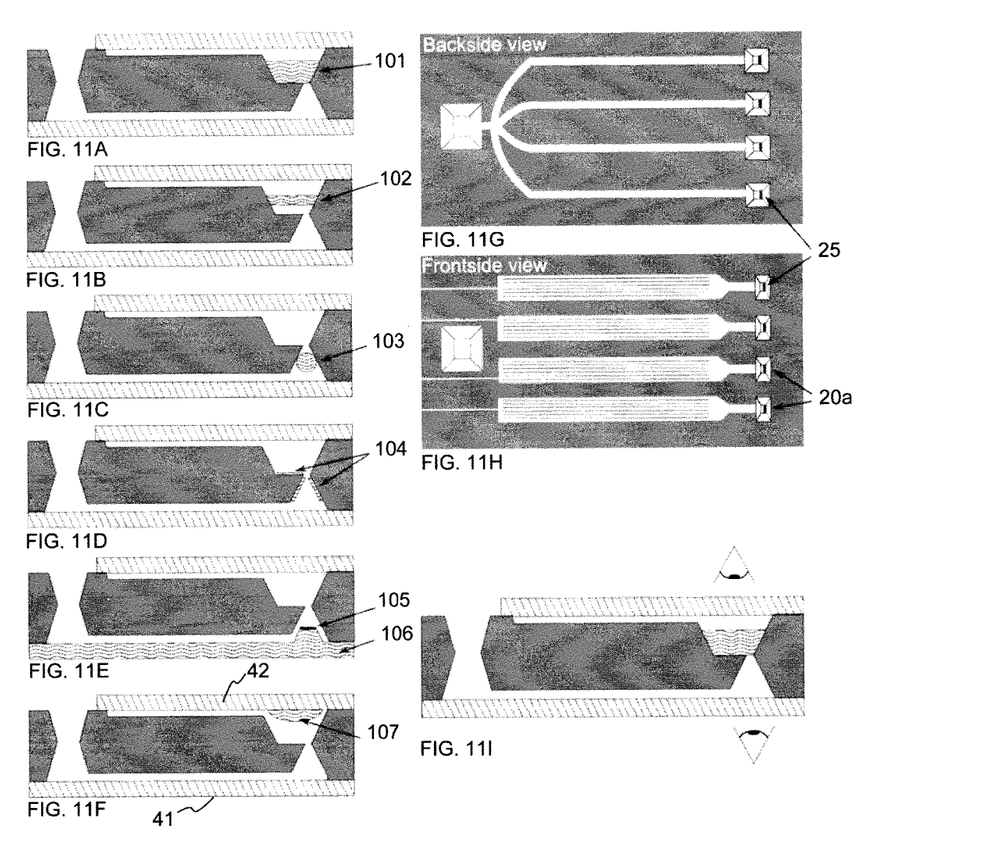
FIG. 11 (11A-11I) aggregates several examples of use of the present microfluidic chips for reagent integration and multiplexing.

Microfluidic vias can be used for reagent integration and detection. As illustrated in FIG. 11, use can be made of hydrogel 101 (FIG. 11A), paper 102 or membrane (FIG. 11B), sphere or plug 103 (FIG. 11C), suitably placed, integrated or spotted in chips exhibiting stepped vias 20a, having a flat surface for facilitating reagent integration (while preserving capillary traction), according to embodiments such as depicted in FIG. 11. Independent vias and channels are provided for multiplexing. Reagent integration, plug placement, hydrogel integration or spotting can be possible as each detection zone is a well-defined reservoir. In addition, each via 20a can be functionalized 104 (FIG. 11D), or filled with a different reagent for multiplexing or control. Sealing by the cover films 41, 42 can be done after reagent integration. Detection, FIG. 11I, can be done from either side of the chip, depending on the application.

In variants, FIG. 11F, the hydrogel 107 can be patterned directly on the upper/lower dry film 42 (before laminating the film), easier to fix than in the cavity, where it can leak out. In embodiments such as depicted in FIG. 11E, a plastic with a protrusion can be used in place of a dry-film, which protrusion is patterned with biological receptors. Such a plastic cover can be obtained by hot embossing or injection molding.

Functionalized hydrogels are particularly interesting for introducing receptors for analytes inside the vias 20a. Hydrogels are networks of hydrophilic polymers, which can be functionalized with receptors for analytes or can hold beads (e.g. ~0.2 micrometer to 10 micrometer beads) coated with receptors. Functionalized hydrogels can be used for DNA-based assays and immunoassays.

Among the various experiments conducted by the inventors with the present chips, an example is now discussed, which concerns a hydrogel functionalized with streptavidin and photopatterned in a via 20a. One of the prepolymers was functionalized with streptavidin (commercially available). Biotin-ATTO 590 and some photoinitiator were added to the prepolymers. After mixing, ~0.5 µL of solution was added to one via 20a (on the top face of the chip, see e.g., FIG. 11I) followed by exposure to UV light (2 min at ~365 nm), which resulted in the crosslinking of the hydrogel. Prior to addition of the hydrogel, Si chips were dipped into BHF for a few seconds to etch the native oxide and make the surface hydrophobic for better confinement of the hydrogel in the via. Without any additional surface treatment, a few nanometers of $SiO_2$ (native oxide) forms on Si surface within a few hours at room temperature and makes the channel walls hydrophilic again. Rinsing uncrosslinked prepolymers, photoinitiator and free biotin-ATTO 590 was done by adding and removing 3 times a droplet of PBS buffer using a pipette. A confined gel can accordingly be obtained. These reagent integration steps can be done at a full wafer-level using automated spotting or liquid dispensing tools prior to dry-film lamination to increase the throughput of the process.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials could be used for the cover-film.

The invention claimed is:

1. A method of fabrication of a microfluidic chip, comprising:
   providing a wafer of semiconductor material having a diamond cubic crystal structure, exhibiting two opposite main surfaces, one on each side of the wafer, and having, each, a normal in a <100> or <110> direction; and
   performing self-limited, anisotropic wet etching steps on both of the two main surfaces from each side of the wafer, to create a via extending transversely through a thickness of the wafer, at a location such that the via connects an in-plane microchannel on a first one of the two main surfaces to a second one of the two main surfaces, the via exhibiting slanted sidewalls as a result of the self-limited wet etching.

2. The method of claim 1, wherein performing the self-limited wet etching steps comprises performing a self-limited wet etching step on each of:
   the first one of the two main surfaces to concomitantly create the in-plane microchannel and a first portion of the via that extends from the first one of the two surfaces; and
   the second one of the two main surfaces to create a second portion of the via that extends from the second one of the two surfaces, the second portion of the via rejoining its first portion to form said via.

3. The method of claim 2, wherein the self-limited wet etching steps are performed at locations on each side of the wafer such that the via connects at least one in-plane microchannel on the first one of the two main surfaces to at least one in-plane microchannel on the second one of the two main surfaces.

4. The method of claim 1, wherein the self-limited wet etching steps are performed concomitantly on each of the two main surfaces to concomitantly create in-plane microchannels on each of the two main surfaces and the via, the via connecting at least one of the in-plane microchannels on the first one of the two main surfaces to at least one of the in-plane microchannels on the second one of the two main surfaces.

5. The method of claim 4, wherein providing the wafer comprises:
   providing a wafer that comprises: a double-side-polished wafer body exhibiting said two main surfaces; and a hard mask on each of the two main surfaces, the hard mask being one of: an oxide or a nitride hard mask; and
   performing photolithography and etching steps to remove portions of the hard mask, such that the self-limited, anisotropic wet etching steps result in etching exposed portions of the wafer body, to create said one or more in-plane microchannels on each of the two main surfaces and the via.

6. The method of claim 5, wherein the photolithography and etching steps are performed to remove two portions of the hard mask which are non-contiguous and have distinct in-plane dimensions or orientations, such that a gap remains therebetween, to achieve a mask correction such that a subsequent self-limited, anisotropic wet etching step of two corresponding exposed portions of the wafer body results in creating two corresponding cavities etched through the thickness of the wafer, with the two cavities rejoining at a level of said gap.

7. The method of claim 1, wherein the method further comprises: creating boundaries of the microfluidic chip by performing a further self-limited wet etching step, concomitantly with said self-limited wet etching steps, the created boundaries extending transversely through a portion of the thickness of the wafer, such that a residual thickness of the wafer at a level of the boundaries enables separation of the microfluidic chip from a remainder of the wafer, by cleaving it by hand; and separating the chip from the remainder of the wafer by cleaving it by hand.

8. The method of claim 1, wherein the method further comprises, after performing the self-limited wet etching steps, applying: a first cover-film on said first one of the two main surfaces, which preferably covers an opening of the via as well as one or more in-plane microchannels on said first one of the two main surfaces; and, a second cover-film on said second one of the two main surfaces to cover one or more in-plane microchannels on said second one of the two main surfaces, wherein the second cover-film applied comprises an opening facing an opening of the via on said second one (S2) of the two main surfaces.

9. The method of claim 8, wherein applying the first cover-film or the second cover-film comprises:
providing a film comprising at least two layers, including a cover-film and a backing film;
applying the cover film against a surface of the wafer by laminating the backing film; and
removing the backing film,
wherein the cover-film applied is a dry-film resist, and wherein the cover-film fulfills one or more following conditions: the cover-film comprises an epoxy resin; the cover-film is a laminate sheet; the cover-film has a Young's modulus between 3 gigapascal and 5 gigapascal; and a thickness of the dry-film resist applied is between 10 µm and 100 µm.

10. A microfluidic chip obtainable by the method of claim 1, comprising: a wafer of semiconductor material having a diamond cubic crystal structure, exhibiting two opposite main surfaces, one on each side of the wafer, and having, each, a normal in the <100> or <110> direction, wherein the wafer comprises a via extending transversely through the thickness of the wafer to connect an in-plane microchannel on a first one of the two main surfaces to a second one of the two main surfaces, the via exhibiting anisotropically wet etched, slanted sidewalls.

11. The microfluidic chip of claim 10, further comprising one or more microchannels on one or each of the two main surfaces, which microchannels exhibit, each, anisotropically wet etched, slanted sidewalls.

12. The microfluidic chip of claim 10, wherein said via connects at least one in-plane microchannel on the first one of the two main surfaces to at least one in-plane microchannel on the second one of the two main surfaces.

13. The microfluidic chip of claim 10, further comprising a cover-film on one or each side of the wafer, the cover-film covering one or more in-plane microchannels and an opening of the via on one of the two main surfaces.

14. The microfluidic chip of claim 13, wherein the cover-film is a dry-film resist, having a thickness between 10 µm and 100 µm.

15. The microfluidic chip of claim 14, wherein the cover-film fulfills one or more following conditions: the cover-film comprises an epoxy resin, the cover-film is a laminate sheet, and the cover-film has a Young's modulus between 3 gigapascal and 5 gigapascal.

* * * * *